US008335241B2

(12) United States Patent  
Huber et al.

(10) Patent No.: US 8,335,241 B2
(45) Date of Patent: Dec. 18, 2012

(54) SYSTEM AND METHOD FOR OPERATING A BUS SYSTEM

(75) Inventors: Martin Huber, Wartenberg (DE); Hendrik Koehler, Hallbergmoos (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 206 days.

(21) Appl. No.: 12/725,932

(22) Filed: Mar. 17, 2010

(65) Prior Publication Data

US 2010/0174843 A1    Jul. 8, 2010

Related U.S. Application Data

(62) Division of application No. 11/817,658, filed as application No. PCT/EP2006/001161 on Feb. 9, 2006.

(30) Foreign Application Priority Data

Mar. 2, 2005  (DE) .......................... 10 2005 009 495
Jul. 25, 2005  (DE) .......................... 10 2005 034 652

(51) Int. Cl.
    *H04J 3/06*   (2006.01)
(52) U.S. Cl. ........ 370/512; 370/389; 370/503; 370/509; 370/546
(58) Field of Classification Search .................. 370/389, 370/412, 503, 509, 512
    See application file for complete search history.

(56) References Cited

U.S. PATENT DOCUMENTS

| | | | |
|---|---|---|---|
| 4,022,973 A | 5/1977 | Stackhouse et al. | |
| 4,142,215 A | 2/1979 | Roberts | |
| 5,161,156 A * | 11/1992 | Baum et al. | 714/4.2 |
| 5,235,595 A | 8/1993 | O'Dowd | |
| 5,265,832 A | 11/1993 | Wesling et al. | |
| 5,550,864 A | 8/1996 | Toy et al. | |
| 5,649,296 A | 7/1997 | MacLellan et al. | |
| 5,654,969 A | 8/1997 | Wilhelmsson | |
| 5,675,811 A | 10/1997 | Broedner et al. | |
| 5,687,356 A | 11/1997 | Basso et al. | |
| 5,719,858 A | 2/1998 | Moore | |
| 6,205,119 B1 | 3/2001 | Kaczynski | |
| 6,504,849 B1 | 1/2003 | Wang et al. | |
| 6,574,284 B1 | 6/2003 | Jordan | |
| 6,697,874 B1 | 2/2004 | Friden et al. | |
| 7,069,123 B2 | 6/2006 | Lapointe | |
| 2002/0083233 A1 | 6/2002 | Owen et al. | |
| 2003/0172797 A1 * | 9/2003 | Juszkiewicz et al. | 84/601 |
| 2005/0256969 A1 | 11/2005 | Yancey et al. | |

FOREIGN PATENT DOCUMENTS

EP    1465370    10/2004

(Continued)

OTHER PUBLICATIONS

Office Action for related U.S. Appl. No. 11/817,658, Jun. 23, 2011, pp. 1-15.

(Continued)

*Primary Examiner* — Man Phan
*Assistant Examiner* — Robert M Morlan
(74) *Attorney, Agent, or Firm* — Ditthavong Mori & Steiner, P.C.

(57) ABSTRACT

A bus system for the real-time communication of a superordinate unit with one or more subordinate units is used for exchanging address and data information via a bus. For the rapid exchange of messages, further fields are provided between the fields for the address and data information.

6 Claims, 12 Drawing Sheets

FOREIGN PATENT DOCUMENTS

| | | |
|---|---|---|
| WO | WO 00/24165 | 4/2000 |
| WO | WO 2004/066576 | 8/2004 |
| WO | WO 2006/092201 A2 | 9/2006 |

OTHER PUBLICATIONS

Final Office Action for related U.S. Appl. No. 11/817,658, dated Mar. 2, 2011, pp. 1-24.

Office Action for related U.S. Appl. No. 11/817,658, dated Sep. 16, 2010, pp. 1-24.

International Preliminary Report on Patentability, PCT/EP2006/001161, Sep. 11, 2007, pp. 1-13.

International Search Report, WO 2006/092201 A3, Sep. 27, 2006, pp. 1-11.

* cited by examiner

SYSTEM AND METHOD FOR OPERATING A BUS SYSTEM

CROSS-REFERENCE TO RELATED APPLICATIONS

The present application is a divisional of U.S. application Ser. No. 11/817,658, filed on Aug. 31, 2007, which is a national phase application of PCT Application No. PCT/EP2006/001161, filed on Feb. 9, 2006, and claims priority to German Application No. 10 2005 034 652.9, filed on Jul. 25, 2005 and German Application No. 10 2005 009 495.3, filed on Mar. 2, 2005, the entire contents of which are herein incorporated by reference.

FIELD OF THE INVENTION

The present invention, according to various embodiments, relates to a bus system, especially a Serial Radio Controlled Bus (RCBSER) for controlling, for example, external antenna-tuning units, amplifiers and filters etc. in real time.

BACKGROUND OF THE INVENTION

In a serial bus system, message processing based on a stored communication of messages is a standard procedure. The messages are communicated from bus node to bus node, wherein the messages of the currently-processing bus node are treated preferentially. With this type of node-related communication of messages, a real-time capability cannot be provided, because the dwell time of a message in the memory of the bus nodes is unpredictable and can, at the very most, be indicated statistically.

By contrast with synchronous buses, in which a certain portion of a synchronous channel is assigned to a special node for a certain time, an asynchronous control allows the communication of several requests for small data quantities, without the need for an interruption of the message transmission. Documents U.S. Pat. No. 5,719,858 and EP 1 465 370 A1 propose systems, which allow an asynchronous transmission on the basis of a synchronous physical channel. Accordingly, it is possible to provide an environment for communication between two nodes, which also satisfies stringent requirements with regard to time conditions. For example, in the case of U.S. Pat. No. 5,719,858, several nodes are connected to a TDM (time division multiplexed) bus, on which a certain bandwidth is made available to several bus nodes. This is then distributed to the individual units using a time-slice method. In the case of EP 1 465 370 A1, a data telegram is subdivided for asynchronous processing and packed into so-called "clocked frames", so that it is possible to allow a synchronous data transmission on a synchronous bus.

The Manchester coding method has been established as the standard method for bus systems. It is simple to implement, direct-current-free and allows the auto-synchronization of stations communicating with one another, so that a separate clock-pulse supply is not required.

SUMMARY OF THE INVENTION

In accordance with various embodiments of the present invention, communication in a bus system is accelerated, thereby improving its real-time capability.

In accordance with various embodiments of the present invention, a bus system with the features of claim 1 is provided, and a method with the features of claim 11 is provided.

In the serial bus system, bit information can be exchanged between units in real time via a synchronization signal, and in parallel to this, messages of greater length can be communicated in an asynchronous manner.

Within this bus system, a central bus node or a specifically-marked bus node is defined as the superordinate unit, which is connected via a bus to several other bus nodes, defined as the subordinate units, through which it communicates.

In particular, synchronization signals, with which time-critical signals are transmitted from unit to unit, are constantly exchanged between the individual units. In parallel to this, messages of a finite length can be transmitted or exchanged between the individual units asynchronously and completely independently of the synchronization signals.

Advantageous further developments are specified in the dependent claims.

It is already known that a header, which, in the present case, allows the receiver to be synchronized for the reception of a message, can be attached to data telegrams within message systems in addition to the address and data information. A telegram of this kind is represented in the realization described below, for example, by 24 fields, wherein 13 fields are used for address information and 8 fields for data. The 13 fields for address information refer not only to the addresses of the individual subordinate units, but also determine the parameters addressed or to be modified within the respective supplementary device.

The header of the message indicates not only the beginning of a message, but is used for the synchronization of the units. This character sequence, also referred to as a synchronous word, allows the receiver to recognise the beginning of the subsequent data word.

To allow an initial synchronization between the individual units, a so-called synchronization frame is first transmitted. This ensures the mutual calibration of a common clock pulse and the assignment of the fields of a message to their coding. If no messages or data telegrams are transmitted, synchronization frames are constantly transmitted from one unit to the next unit. These also ensure the synchronization of the clock-pulse generators.

The exchange of information in real time is based upon the constantly-exchanged bit signal or clock-pulse signal between the individual units. The initial transmission of the synchronization frame specifies the assignment of a character 'X' to '0' or '1' and 'Y' to '0' or '1'. This information is communicated to all units on the serial bus system, so that the same signal is transmitted on all connecting lines. If one unit wishes to transmit a bit message to the superordinate unit, this changes the assignment 'X' to '0' or '1' and/or 'Y' to '0'. In the subsequent unit, this signal is combined in an AND element with its own clock-pulse signal to form a combined signal and transmitted to the unit disposed in the next highest position. In this manner, a bit signal can be transmitted very rapidly from unit to unit and to a master. A data packet, which is independent of the bit information, is distributed bit by bit to intermediate bit positions so that data packets are transmitted in an asynchronous manner alongside the clock-pulse signal. Accordingly, it is possible to speak of channels, in which, on the one hand, bit information can be exchanged constantly in real time and, on the other hand, a relatively long message can be transmitted asynchronously with time distribution.

Moreover, the real-time capability is further provided in that the bit information is not placed in intermediate storage. The bit signals are combined in the units as a continuous signal by an AND linking with the internally-generated bit signal and implemented without delay. Data telegrams must initially be extracted and read into a memory in their full length in order to be interpreted.

The use of the differential Manchester code allows the fields to be presented with one bit each so that the resulting message length is 48 bits, and the length of the data and address information is specified as 8 and 13 bits respectively. The deviations from the generally-used method of coding introduced here, allow the definition of further characters, which, for their part, allow the definition of further control characters. By way of deviation from a standard alphabet, which contains the characters 'K', 'J', '0' and '1', 'READY', 'TX_ACTIVE' and 'CARRIER_MAGNITUDE' can be created through the additional characters or control signals 'X', 'Y'.

In order to communicate the messages in the subordinate units connected sequentially, for example, via coaxial or optical-fiber cable, a memory is provided in each of the supplementary devices, in which messages are placed into intermediate storage before they are communicated, thereby guaranteeing a controlled message transmission from subordinate unit to subordinate unit. Additionally, a corresponding logic unit provides the means for processing the messages within a subordinate unit or for transferring a message to another subordinate unit. The memory and logic unit are realised, for example using "programmable gate arrays" (FPGA-component) in the devices, thereby allowing future requirements for the performance capability of the bus to be taken into consideration.

Providing the integrated memory and the logic unit, achieves a communication procedure for handling standard messages and time-critical messages of the following type:

1.) If a subordinate unit receives a message, a check is first carried out to determine whether the internal memory already contains a message. If the memory contains a message, the incoming message is entered in the memory and only communicated, if all previously-received messages or messages entered in the memory have been communicated to the subsequent subordinate units or removed from the memory.

2.) If a message is received from a subordinate unit and its memory is empty, the message is communicated directly.

3.) If a time-critical message is received from a subordinate unit, the status of the memory is not checked, but an internal status is directly verified, and the message is communicated only after this.

4.) If a TX_ACTIVE or TX_ACTIVE/CARRIER_MAGNITUDE message is received from the superordinate unit, the setting of the subordinate unit is no longer changed, and an internal status is set. After the reception of a message from a preceding, subordinate unit, this is immediately communicated to the subsequent subordinate unit.

With this general message infrastructure, it is possible to provide a basic functionality, in which individual subordinate units, which are connected to the terminals of the bus, communicate with a superordinate unit via a serial bus. In this context, a reply message regarding the successful adjustment of parameters can be given, or the status of the subordinate units or values such as temperature can be communicated to the superordinate unit. The transmission of bit information via the constantly-exchanged clock-pulse signal additionally allows the rapid exchange of an information unit in real time.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF THE PREFERRED EMBODIMENTS

Figure 1A:
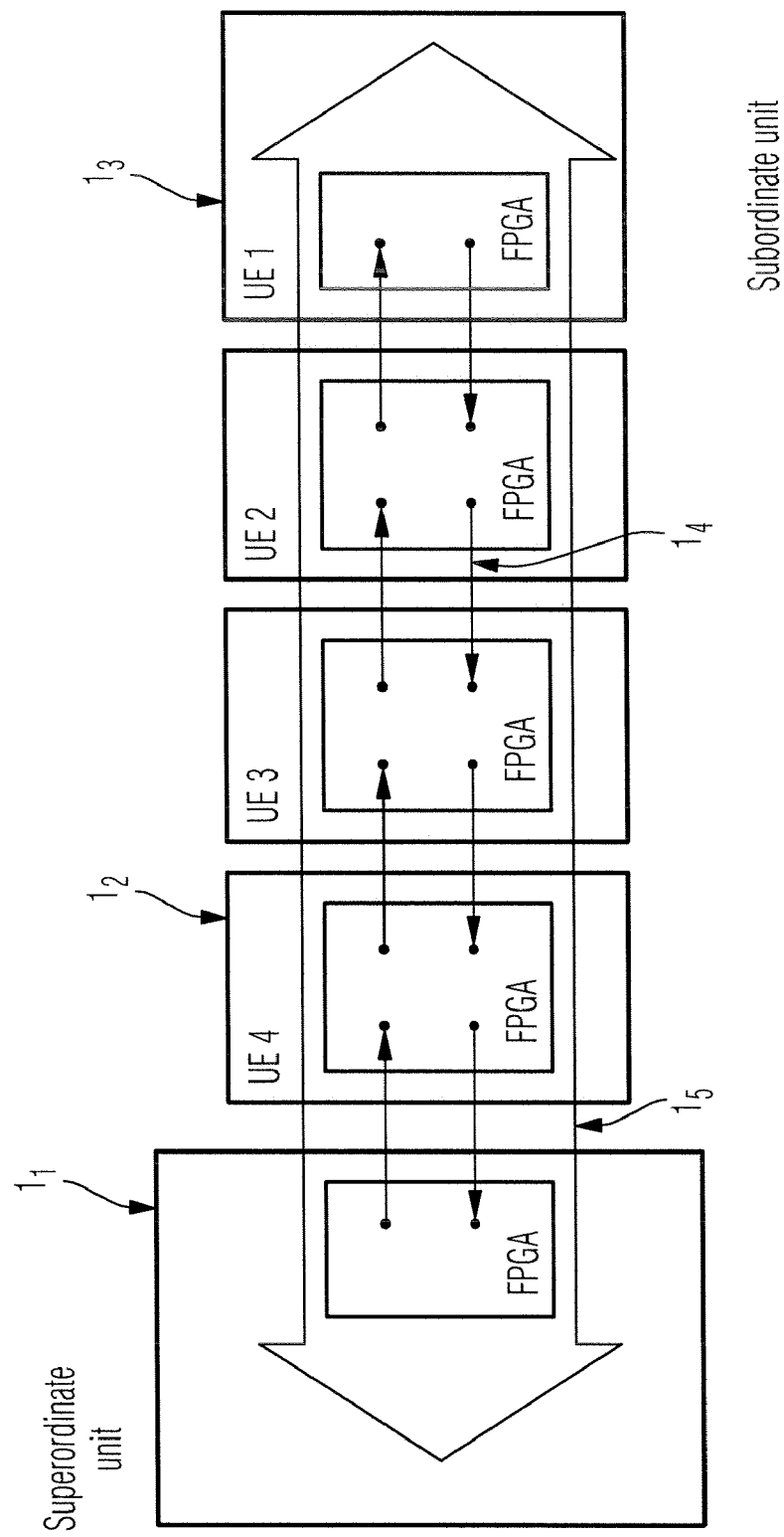
FIG. 1a shows the structure of the serial bus, according to an exemplary embodiment.
Figure 1B:
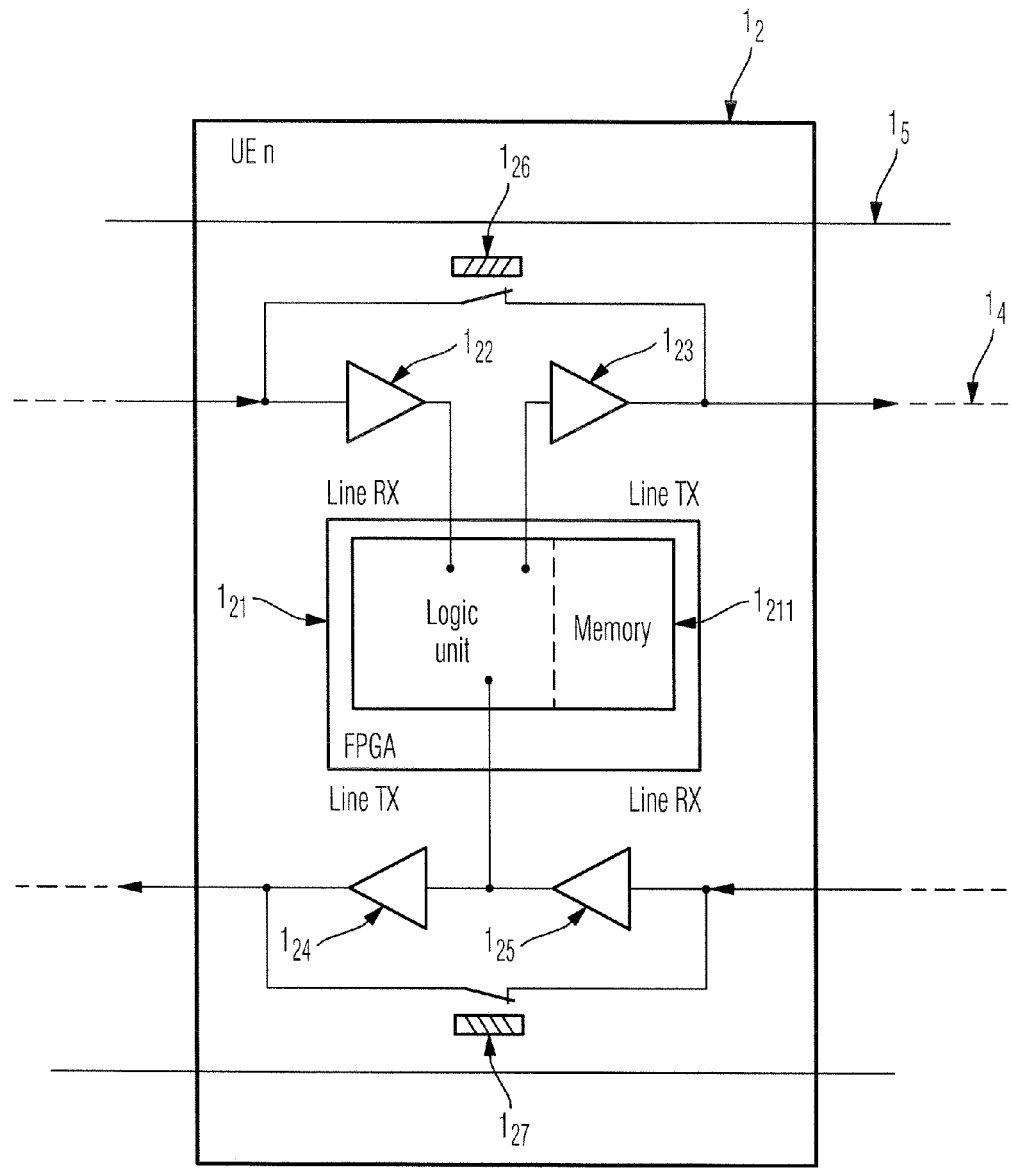
FIG. 1b shows the structure of a subordinate unit, according to an exemplary embodiment.

The structure of the bus system 1 illustrated in FIGS. 1a and 1b is characterized by a superordinate unit $1_1$, to which several subordinate units $1_2$, $1_3$ can be connected. The subordinate units $1_2$, $1_3$ are connected in series to form a series structure. In this context, a first subordinate unit UE4, for example, a pre-selector, is connected via two cables to a superordinate unit ÜE, for example, a radio device, and after that, a second subordinate unit UE3, for example, a standing-wave measuring instrument, is connected via another two cables to the first subordinate unit and so on. A final subordinate unit UE1, for example, an antenna-tuning unit (ATU) terminates the bus $1_5$.

Optical-fiber cables and optical connectors can be used for the cabling $1_4$ instead of coaxial cables. Although the bus system 1 is primarily designed for controlling external modules, the concept described below is also suitable for applications, which require the control of internal modules. By way of simplification, the abbreviation RCBSER is also used to describe the bus $1_5$. It must also be mentioned, that each device unit $1_1$, $1_2$, and respectively $1_3$ has at its disposal, for example, a programmable gate array (FPGA component), which contains a memory $1_{211}$ and controls communication via the bus.

Figure 2:
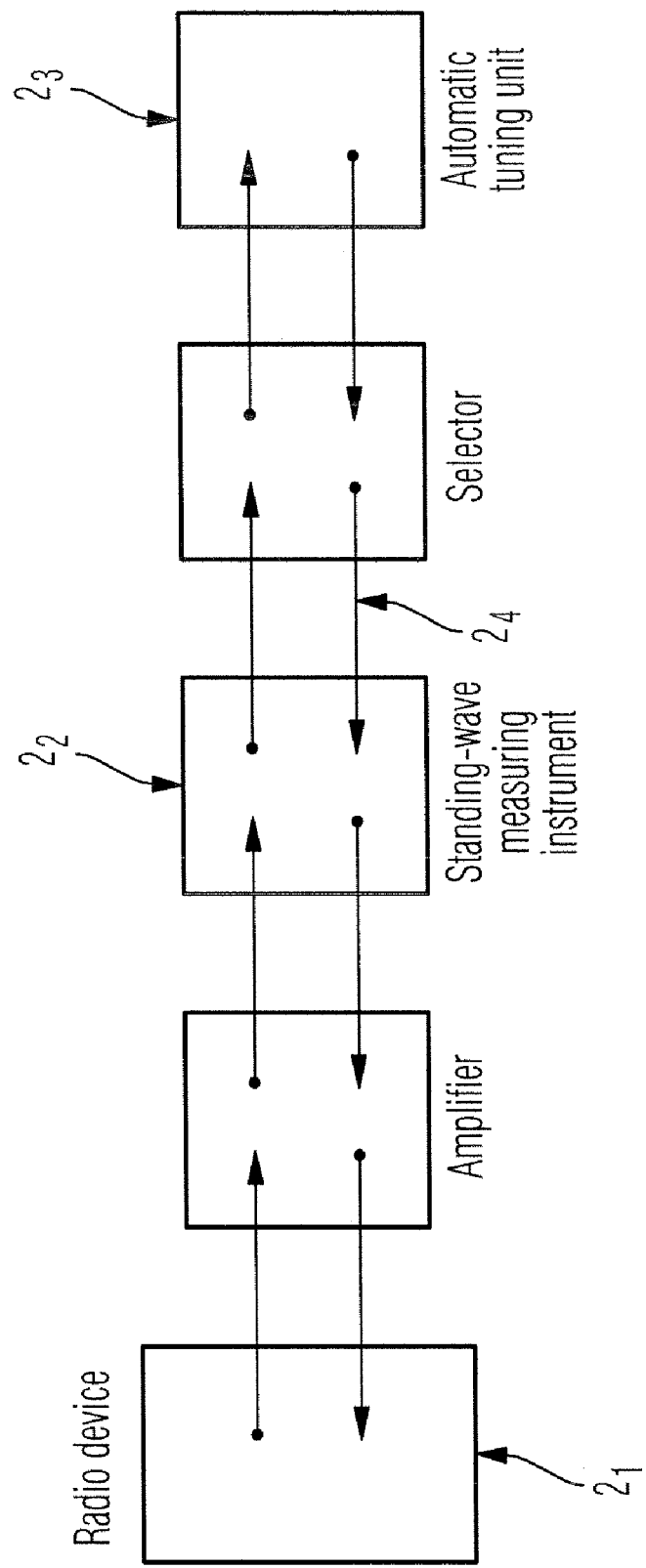
FIG. 2 shows an application of the bus, according to an exemplary embodiment.

One application of the bus system 1 illustrated in FIG. 2 provides the structure of a radio system. In this context, the superordinate unit $1_1$, the radio device $2_1$ and the subordinate units $1_2$ can be supplementary devices $2_2$ such as amplifiers, standing-wave measuring instruments or selectors, which are connected to the radio device, for example, via coaxial and/or optical-fiber cables $2_4$. The bus system 1 is terminated, for example, by an automatic antenna-tuning unit (ATU) $2_3$.

Figure 3:
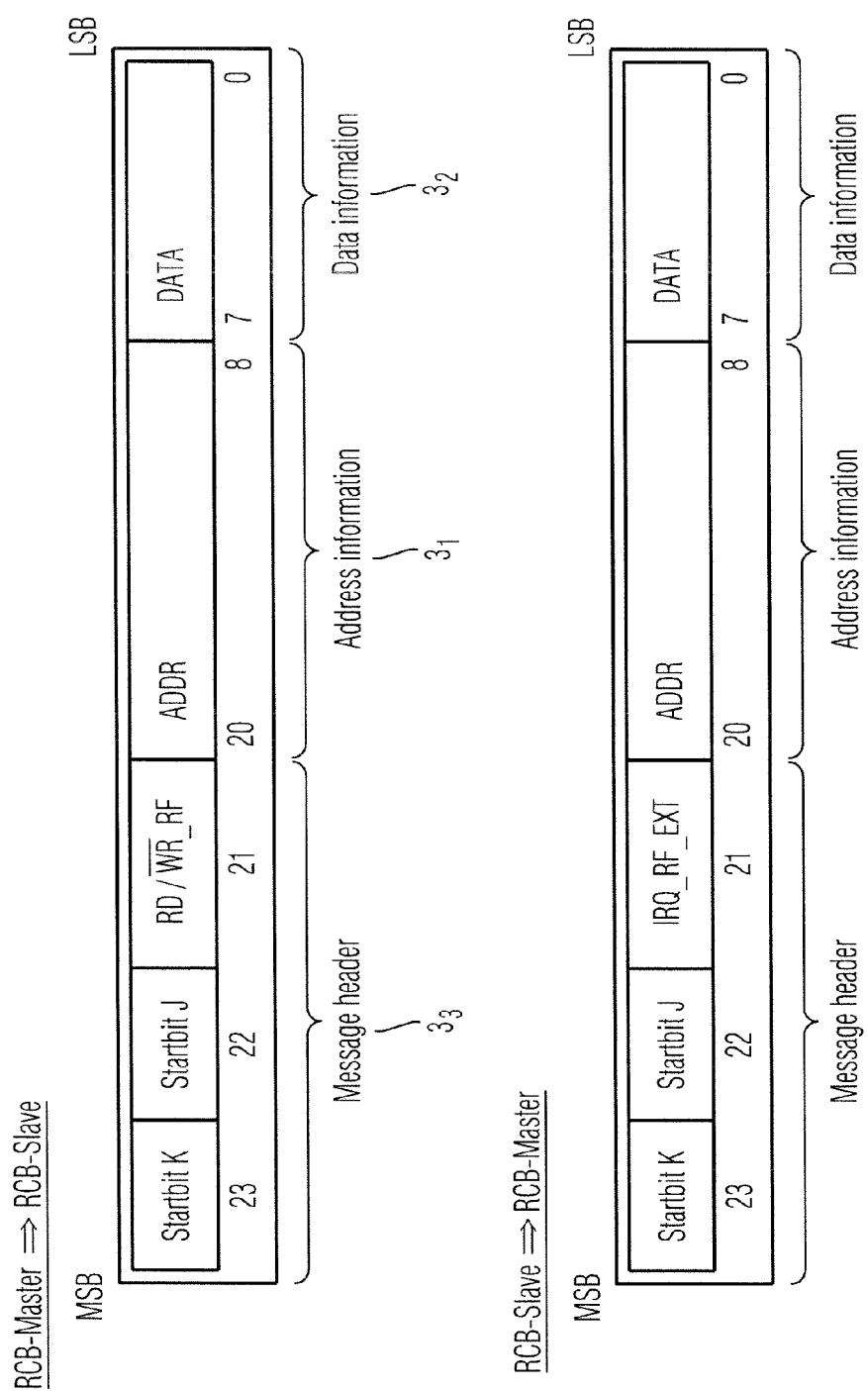
FIG. 3 shows the standard message structure, according to an exemplary embodiment.

As shown in FIG. 3, the standard telegram 3 includes a message header $3_3$, which is formed by a start bit 'K' followed by a start bit 'J' and a subsequent status bit. The status bit is defined either with the character RD/WR_RF or IRQ_R-F_EXT, depending upon whether the transmission is implemented from the superordinate unit to the subordinate units or in the opposite direction. This is followed by an address field $3_1$ and a data field $3_2$. In the message structure shown by way of example, 13 bits are used for the address field and 8 bits are used for the data field.

Figure 4:
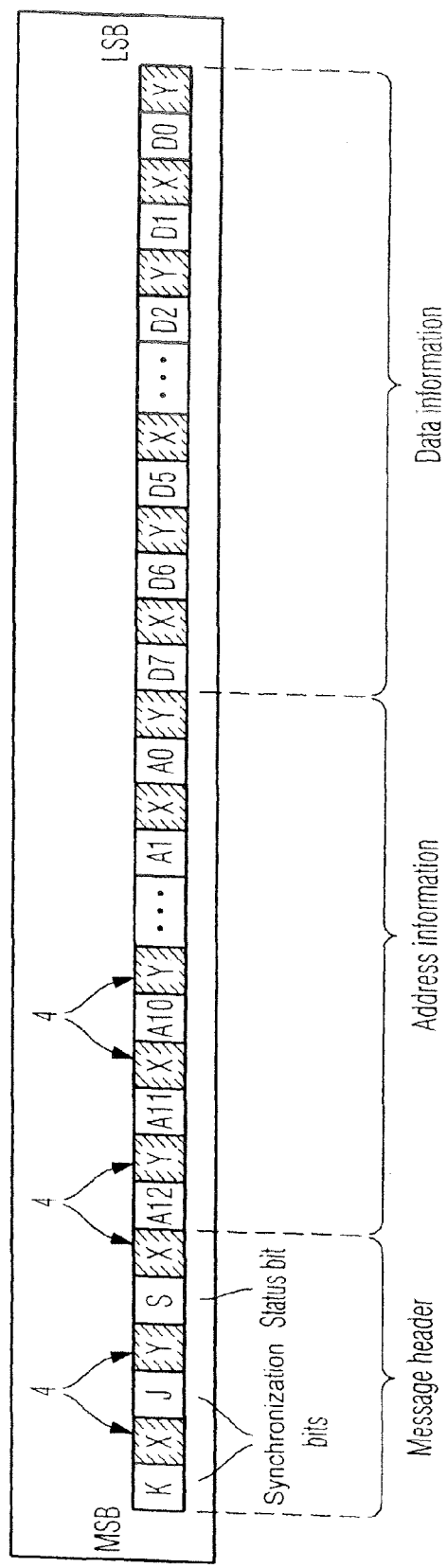
FIG. 4 shows the message structure for rapid transmission of messages, according to an exemplary embodiment.

FIG. 4 shows the bit-wise subdivision of a message in the free positions between the clock-pulse bits or characters. The clock-pulse signal is recognisable as an alternating sequence of characters 'X' and 'Y'. As will be described below, a differential Manchester code is used by preference for the coding of the characters. In this context, the character 'X' is recognisable in that it appears between the first and second start or synchronization bit 'K' and 'J'. The character 'Y' follows the start or synchronization bit 'J'. As a result of this bit-wise subdivision of the message, it is possible to exchange bit information simultaneously and completely independently on the serial bus alongside messages transmitted asynchronously between the units. The alternating insertion of the characters 'X' and 'Y' can be immediately evaluated. The bit information, which is transmitted via the constantly-exchanged clock-pulse signals, is also indicated as a time-critical signal.

Figure 5:
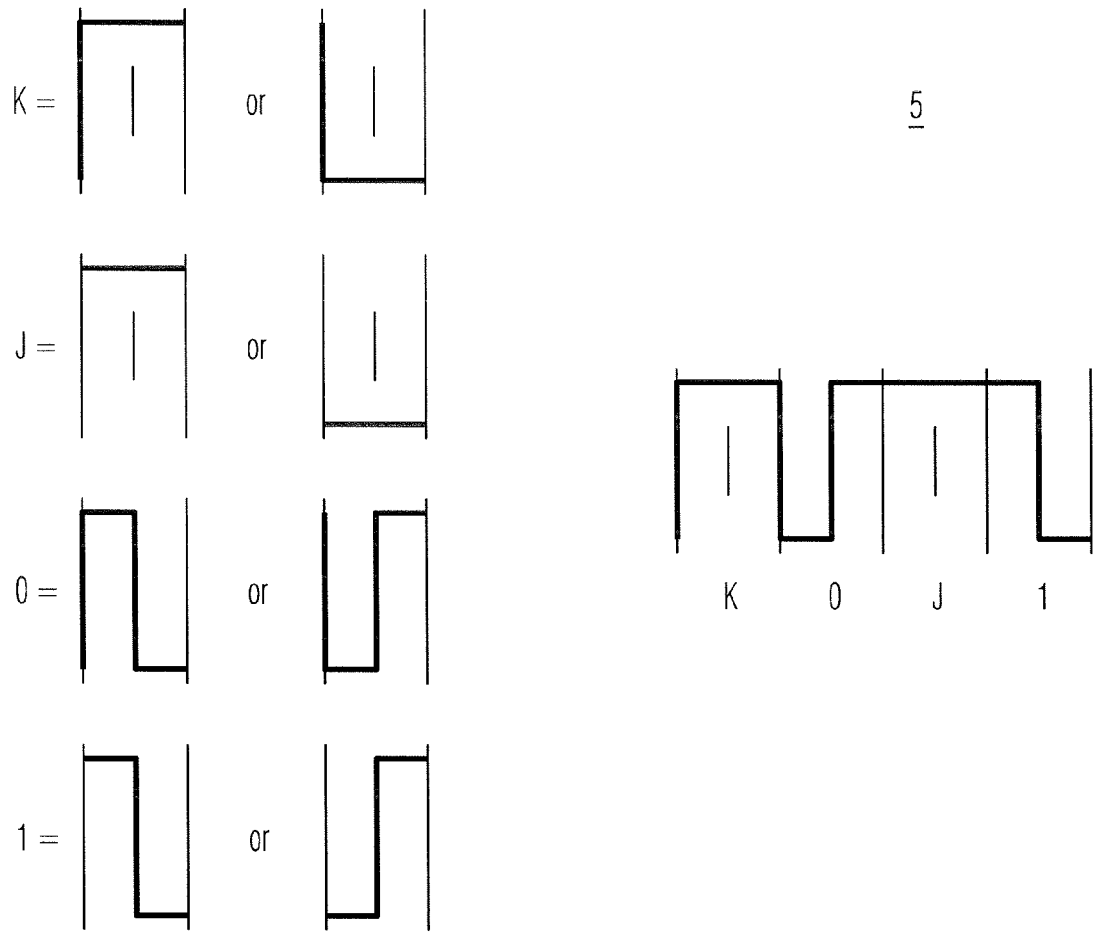
FIG. 5 shows the differential Manchester code, according to an exemplary embodiment.

FIG. 5 shows the structure of the preferred Manchester coding method 5. According to the method 5, a subdivision into bit cells takes place, wherein a different polarisation or amplitude is indicated in the first half of the bit cell by comparison with the second half of the bit cell. This means that an abrupt change of level occurs in each bit cell, which also allows, for example, a simple synchronization of the participating stations. The differentiation of the characters takes place in this context through an edge at the start of the bit. For example, the character '0' is characterized by an edge at the start of the bit, whereas no edge is coded in the case of the character '1'. According to the present, preferred derivative of the Manchester code, two code extensions 'K' and 'J' are additionally adopted in the code alphabet, that is to say, within the quantity of characters used. In this context, the code extension is given in that no change of polarisation or abrupt change of level occurs in the middle of the bit. The character 'K' is characterized by an edge; the character 'J' by 'no edge' at the beginning of the bit.

Figure 6:
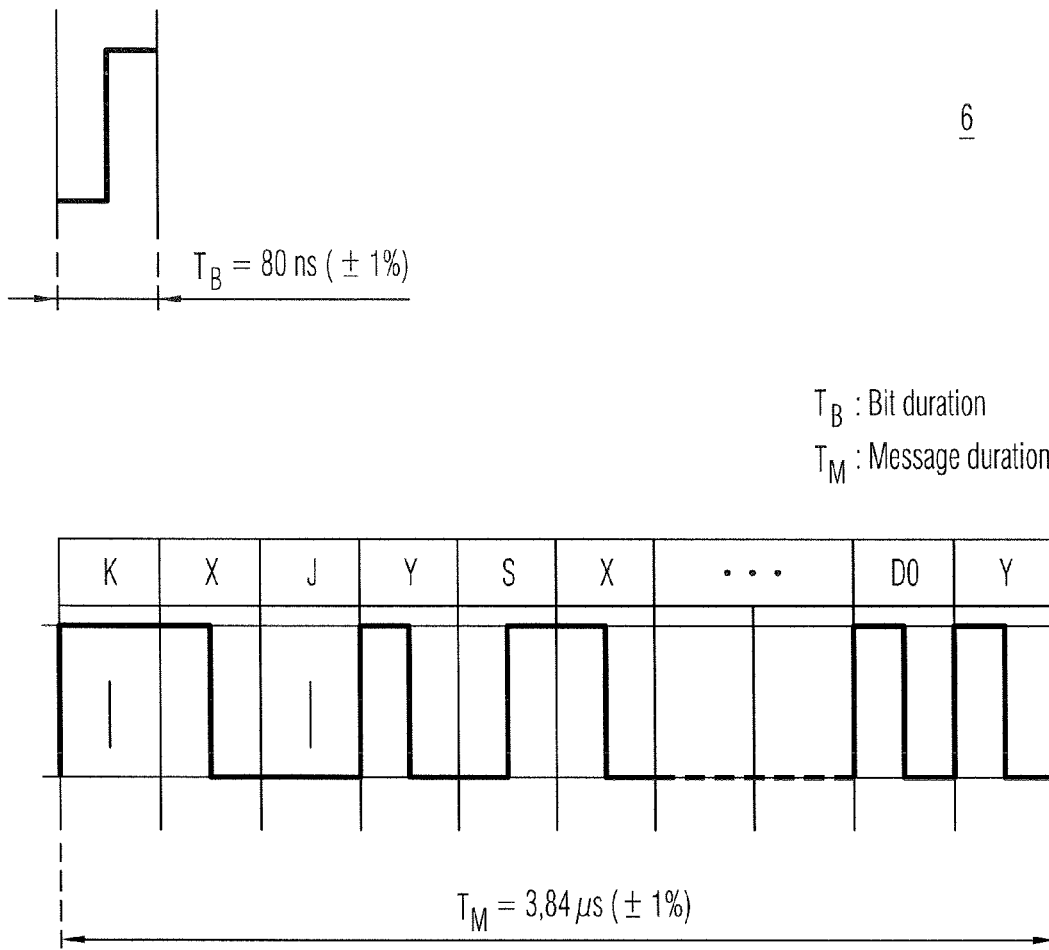
FIG. 6 shows the time behavior of a message for rapid transmission on the bus, according to an exemplary embodiment.

FIG. 6 shows the time behavior or timing 6 of a message telegram, in particular, also of a time-critical message telegram 4. With an exemplary data rate of 12.5 MHz, there is a time allocation of $T_B$=80 ns per bit and accordingly for the entire length of a time-critical telegram $T_M$=3.84 µs (=24×80 ns). This provides a tolerance band of 1% for the safe processing of the messages.

Figure 7A:
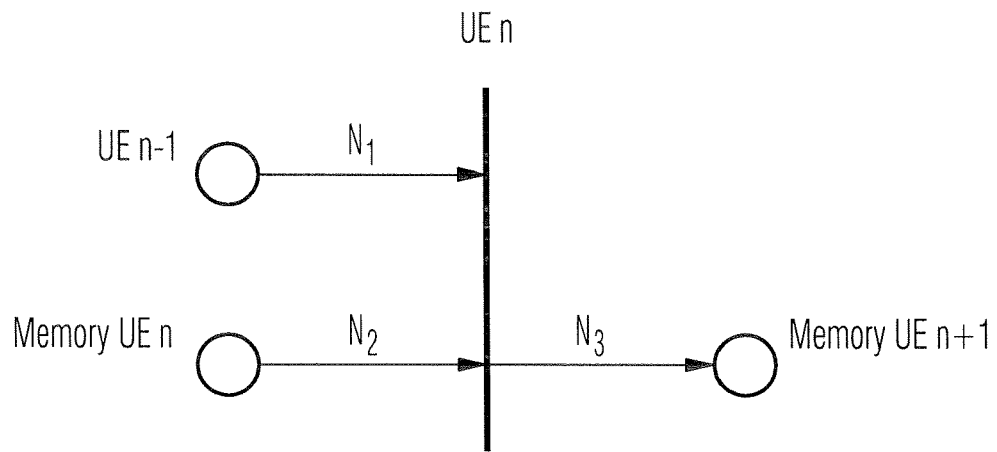
FIG. 7a shows the message exchange between subordinate units in a first phase, according to an exemplary embodiment.
Figure 7B:
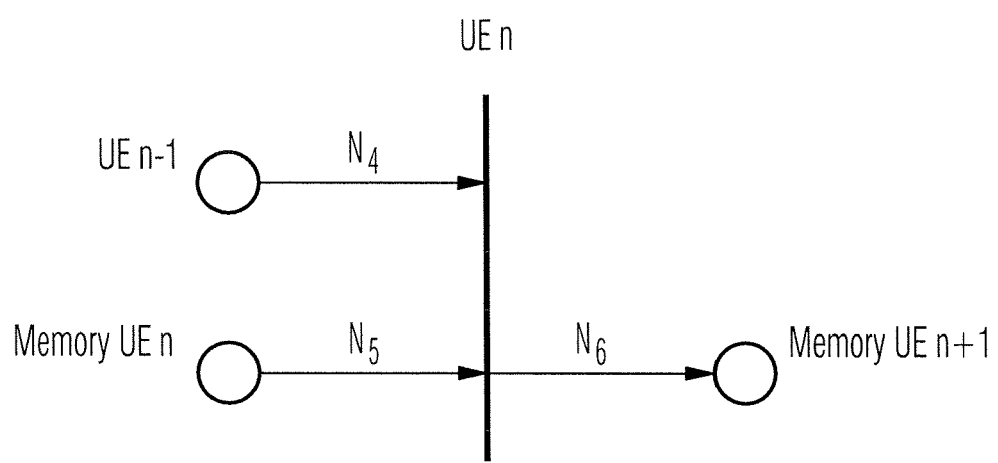
FIG. 7b shows the message exchange between subordinate units in a second phase, according to an exemplary embodiment.

FIGS. 7a and 7b show the standard message processing. FIG. 7a shows the processing of standard messages, which are processed using a memory $1_{211}$.

Standard messages 3 from the superordinate unit $1_1$ to the subordinate units $1_2$ and/or $1_3$ are received simultaneously by the subordinate units $1_2$ and/or $1_3$. This message communication is described as a point-to-multipoint connection.

Standard messages 3 are communicated from the subordinate units $1_3$ to the superordinate unit $1_1$ via the intermediate subordinate units $1_2$. This achieves a smooth running of message communication from one subordinate unit $1_2$ and/or $1_3$ to the superordinate unit $1_1$ on the serial bus $1_5$. Access problems do not occur, because the bus $1_5$ is structured in the direction towards the centre $1_1$ in such a manner that in the short-term, a so-called point-to-point connection is set up respectively between two subordinate units $1_2$ and/or one subordinate unit $1_2$ and the superordinate unit $1_1$ until a message 3 has been successfully communicated to the superordinate unit $1_1$.

Two approaches are possible for processing a standard message 3. FIGS. 7a and 7b illustrate the method of functioning. FIG. 7a shows a first case, in which a subordinate unit UEn receives a message $N_1$ from a subordinate unit UEn−1 via a point-to-point connection and, represented by a message $N_2$, checks whether its own message memory $1_{211}$ is empty. If this is the case, a message $N_3$ is communicated directly to the memory of the subsequent subordinate unit UEn+1.

FIG. 7b shows a second case. If the memory $1_{211}$ already contains at least one message, the received message $N_4$ is stored in the memory $1_{211}$ until the successful processing of all messages contained in the memory $1_{211}$, and only after the processing of the messages in the memory is it communicated as a message $N_6$ to the subsequent subordinate unit UEn+1. The dwell time of the message $N_4$ in the memory depends upon the initial number of messages in the memory $1_{211}$.

Figure 8A:
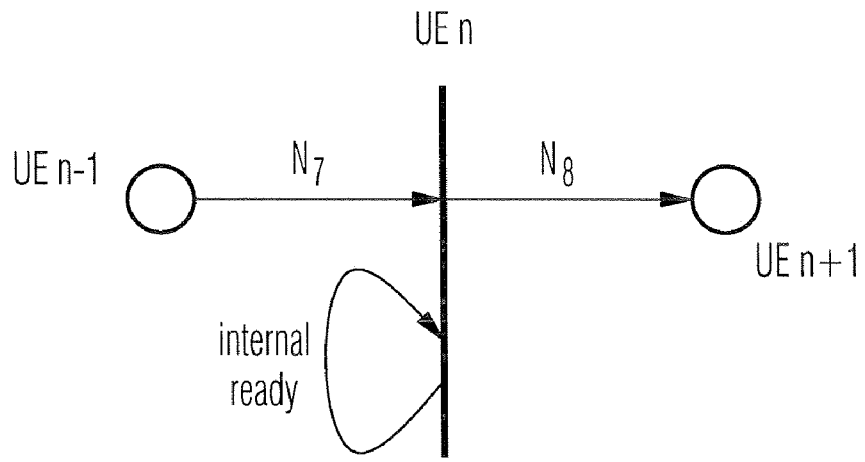
FIG. 8a shows the message exchange for rapid transmission on the bus in a first phase, according to an exemplary embodiment.
Figure 8B:
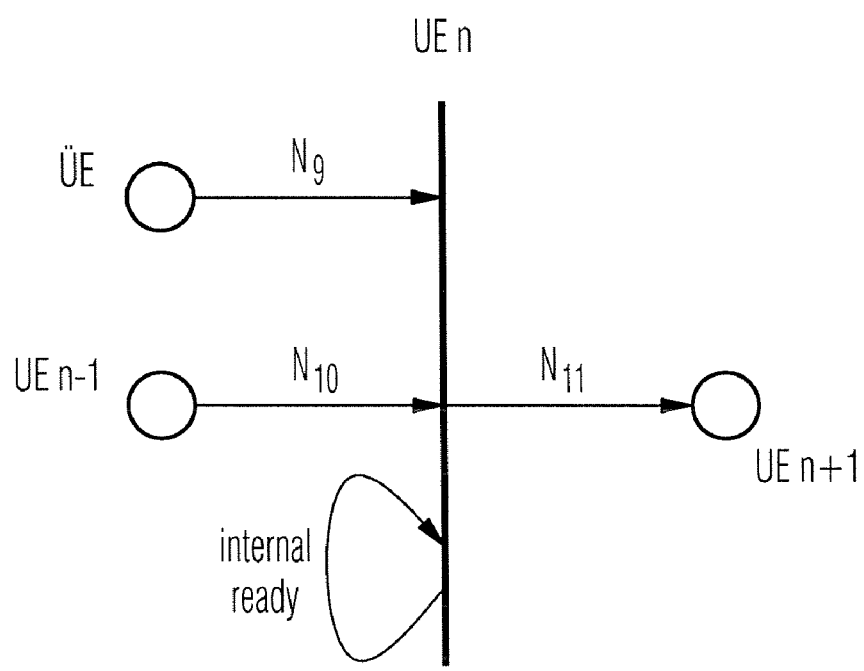
FIG. 8b shows the message exchange for rapid transmission on the bus in a second phase, according to an exemplary embodiment.

Time-critical signals 4, of which the processing is illustrated in FIGS. 8a and 8b, are transmitted if a separate processing and a rapid exchange of messages in the form of bit information are required and possible. This occurs, for example, if, as a superordinate unit UE for the transmission of a high-frequency signal to the subordinate units UE1-UE4, a radio device transmits given settings, for example, amplification factors, filter parameters or settings of an antenna tuning unit, and, shortly before the beginning of the transmission, requests a confirmation regarding the successful setting of the necessary parameters, so that it can then transmit the high-frequency signal. The confirmations are then transmitted in the form of a time-critical signal 4 from the subordinate units UE1-UE to the superordinate unit ÜE. This takes place in such a manner that the last element UE1 of the bus $1_5$ is the first to change the coding of its clock-pulse signal. By contrast with standard messages, time-critical signals are processed separately in the subordinate units, through which they pass.

FIG. 8a shows a first general method of presentation. If a time-critical signal 4, indicated in FIG. 8a by reference $N_7$, of the preceding unit UE2 arrives at the subordinate unit $1_2$ as a result of a preceding message for the high-frequency transmission of the superordinate unit to all or only some of the subordinate units UE1-UE4, for example, to the subordinate unit UE3, an internal status READY is initially checked, and the signal 4 is then transmitted as a time-critical collective message $N_8$ to the subsequent subordinate unit UE3 or in the case of the last subordinate unit UE4 to the superordinate unit ÜE.

FIG. 8b shows the processing in the event of the special TX_ACTIVE signal $10_1$, which refers to an imminent high-frequency signal transmission. In this variant, a READY signal $10_3$ is expected by all subordinate units UE1-UE4 and this is communicated, for example, from subordinate unit UE3 to subordinate unit UE4 and then communicated to the superordinate unit ÜE.

In this context, the communication takes place in such a manner that the superordinate unit ÜE transmits a signal $N_9$ to a subordinate unit UEn. This sets an internal status to READY and waits for a signal $N_{10}$ from a preceding subordinate unit UEn−1 in the bus $1_5$. After interrogating the internal status, a combined signal $N_{11}$ is then transmitted to a subsequent subordinate unit UEn+1.

Figure 9:
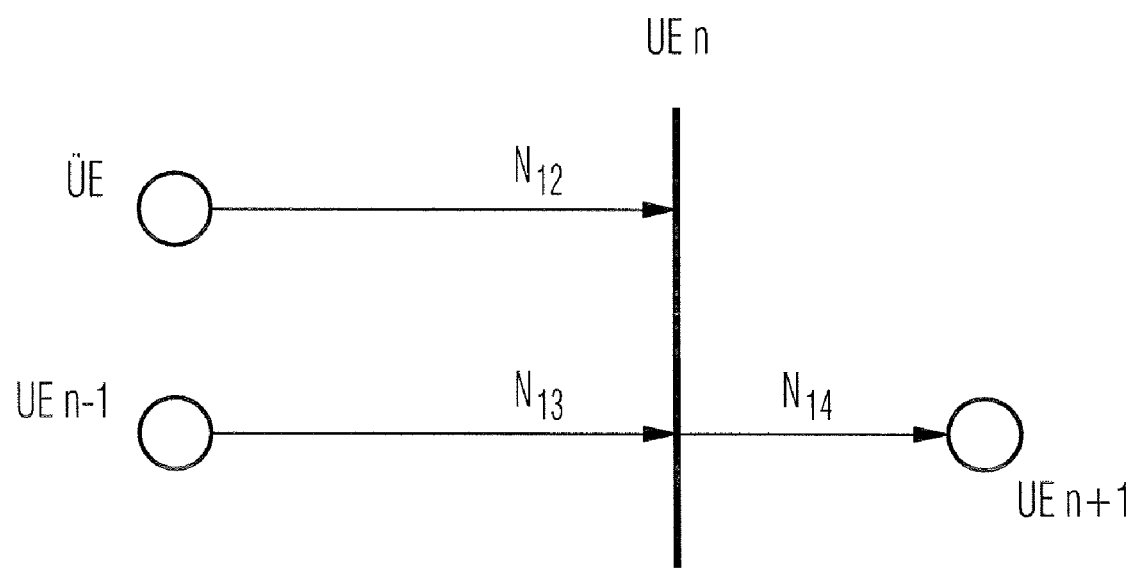
FIG. 9 shows the message exchange for rapid transmission on the bus in a third phase, according to an exemplary embodiment.

FIG. 9 shows a further signal-processing procedure. A signal $N_{12}$ from a superordinate unit ÜE is received by a subordinate unit UEn. When using the bus $1_5$, this refers to the reception of a TX_ACTIVE/CARRIER_MAGNITUDE signal, which characterises the direct transmission mode. Following this, an internal status is optionally set, which is not shown in the drawings. After this, if a signal $N_{13}$ is received from a preceding subordinate unit UEn−1, a signal $N_{14}$ is generated and communicated to a subsequent subordinate unit $1_2$.

Figure 10:
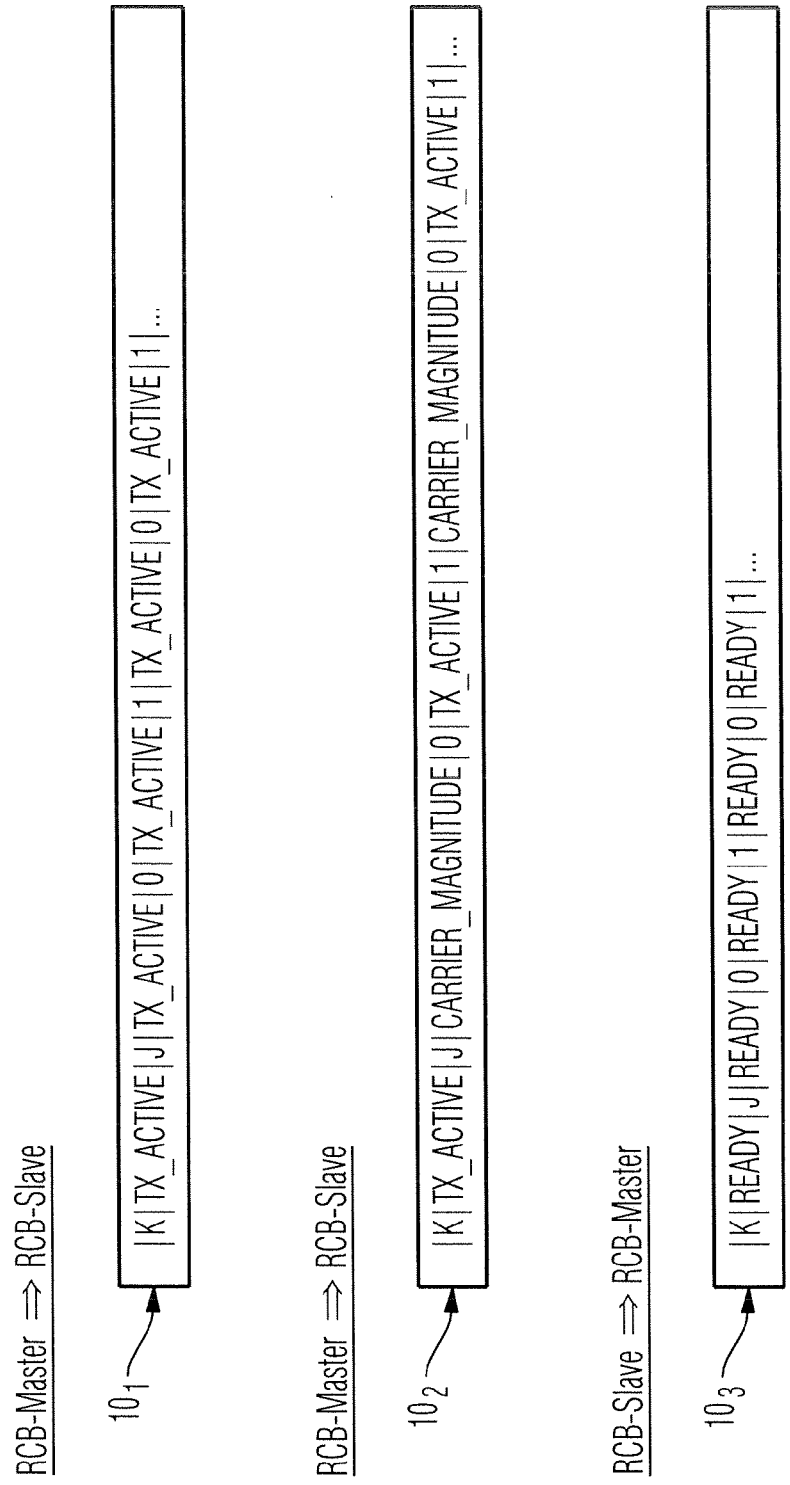
FIG. 10 shows special time-critical messages, according to an exemplary embodiment.

FIG. 10 shows three special signals, in particular, time-critical signals $10_1$, $10_2$, and $10_3$, which are transmitted from the superordinate unit ÜE to the subordinate units UE1-UE and from the subordinate units UE1-UE4 to the centre UE. In this context, a first signal $10_1$ from the superordinate unit ÜE to all subordinate units UE1-UE4 is characterized in that, as a clock-pulse signal, it is coded as a constant sequence of characters 'X'. FIG. 10 shows once again the parallel exchange of real-time bit information and relatively long data packets. The character TX_ACTIVE is characterized in that it is transmitted as a signal $10_1$ from the superordinate unit ÜE to the subordinate units UE1-UE4. A second signal $10_2$ from the superordinate unit ÜE to the subordinate units UE1-UE4 is also communicated using the clock-pulse signal. However, TX_ACTIVE and CARRIER_MAGNITUDE are transmitted in alternation. In this context, CARRIER_MAGNITUDE is transmitted as 'Y'. A preceding sync frame once again ensures a calibration of the clock-pulse generators. In the case of a READY signal $10_3$ from the subordinate units UE1-UE4 to the superordinate unit ÜE, a READY signal is transmitted as described above.

Figure 11:
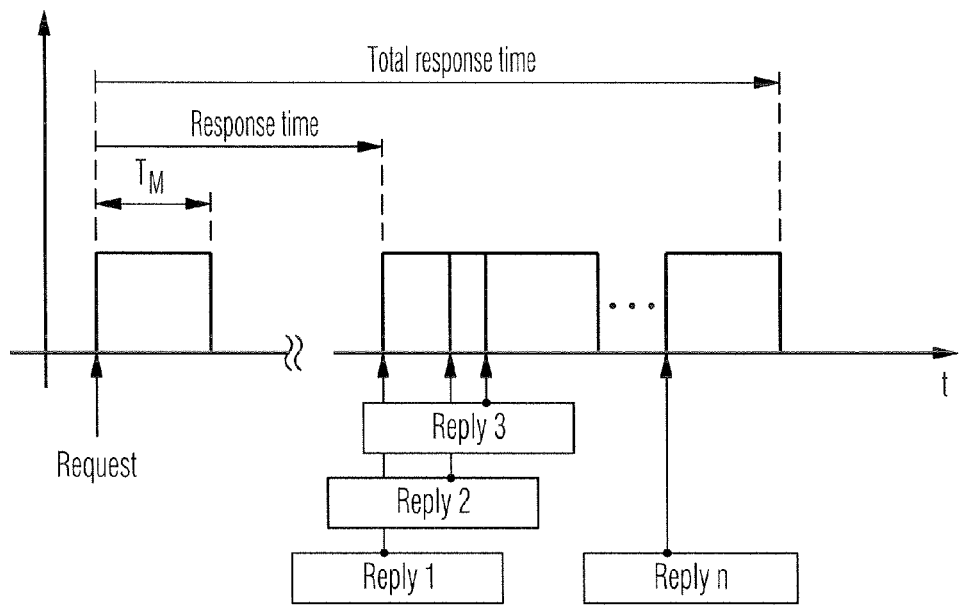
FIG. 11 shows the time behavior of a message transmission in a first phase, according to an exemplary embodiment.
Figure 12:
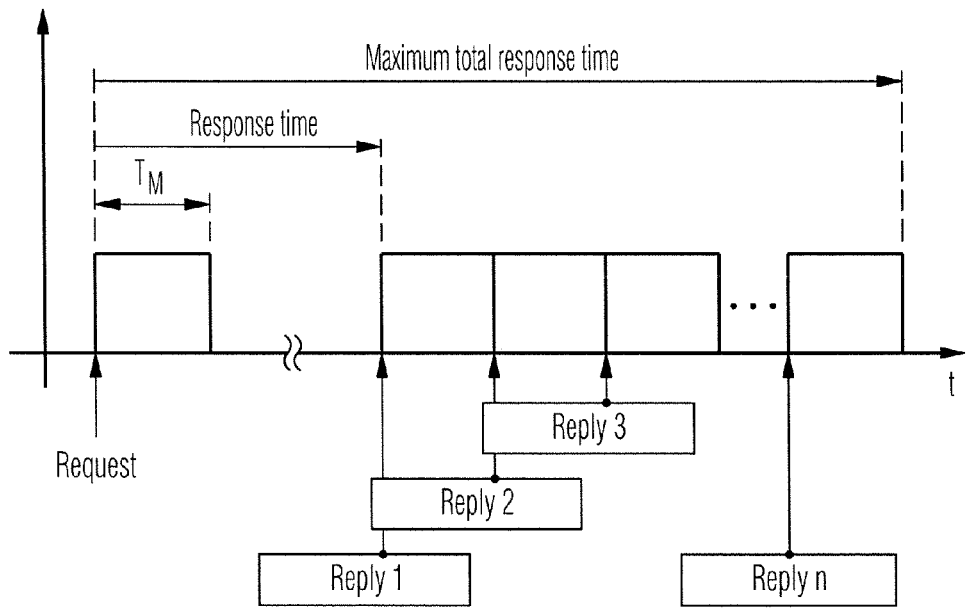
FIG. 12 shows the time behavior of the message transmission in a second phase, according to an exemplary embodiment.

In the form of time diagrams, FIGS. 11 and 12 show an overview of the time course of the bus activity for communicating time-critical signals via the connected subordinate units UE1-UE4 through to the superordinate unit ÜE on the bus $1_5$. After a request of the superordinate unit ÜE of the length $T_M$ and a predetermined response time of the final or terminal subordinate unit UE1 on the bus, the signal regarding the conclusion of the parameter settings in the subordinate units is communicated according to the point-to-point signal-processing method described above from subordinate unit UEn−1 to subordinate unit UEn and finally to the superordinate unit ÜE. The total response time is then obtained as shown in FIG. 11. FIG. 12 shows the conditions for the case, in which a full message duration is required for the evaluation of the internal status.

The invention is not restricted to the exemplary embodiment described. The bus system according to the invention can be used in many different ways. All the elements described and indicated can be combined with one another as required.

The invention claimed is:

1. A method for operating a bus system for the real-time communication of a superordinate unit with one or more subordinate units for the exchange of address information and data information and for the exchange of additional messages comprising the following procedural stages:
   checking whether an internal memory of a subordinate unit contains a message, whenever this subordinate unit receives a message from another subordinate unit; and
   entering the received message in the memory, if the memory already contains a message, and communicating the message only if all messages previously-received or entered in the memory have been communicated to the subordinate unit and communicating a message directly, whenever the message is received from a subordinate unit and the memory is empty,
   wherein in a serial bus system, bit information can be exchanged between units in real time via a synchronization signal, and in parallel to this, messages can be communicated in an asynchronous manner,
   wherein the exchange of information in real time is based upon a constantly-exchanged bit signal or clock-pulse signal between the individual units wherein data packets are transmitted in an asynchronous manner alongside the clock-pulse signal,
   wherein the message is bit-wise subdivided in free positions between bits of the clock pulse signal, and
   wherein the clock pulse signal is recognizable as an alternating sequence of X and Y.

2. A method according to claim 1, wherein a status of the memory is not checked if a time-critical message is received from a subordinate unit, but an internal status is verified directly, and that the message is then communicated, if the status is READY.

3. A method according to claim 2, wherein a quantity of all time-critical messages comprises at least three messages, namely a TX_ACTIVE message, which introduces a transmission mode, a TX_ACTIVE/CARRIER_MAGNITUDE message, which marks the transmission mode, and a READY message, which marks a ready status.

4. A method according to claim 3 wherein the TX_ACTIVE message and the TX_ACTIVE/CARRIER_MAGNITUDE message are transmitted from the superordinate unit, which is a radio device, to the subordinate units, which are supplementary devices to the radio device, and that the READY message is communicated from one subordinate unit to a subsequent subordinate unit, until a final subordinate unit connected directly to the superordinate unit transmits this message to the superordinate unit.

5. A method according to claim 4, wherein all current adjustment procedures are concluded if a supplementary device receives a TX_ACTIVE or TX_ACTIVE/CARRIER_MAGNITUDE message from the radio device.

6. A method according to claim 5, wherein an internal status of the supplementary device is set to READY after the conclusion of the adjustment processes, and that this is immediately communicated to the subsequent supplementary device or radio device after the reception of a READY message from another supplementary device.

* * * * *